(12) United States Patent
Imaizumi et al.

(10) Patent No.: US 10,830,640 B2
(45) Date of Patent: Nov. 10, 2020

(54) ELECTROMAGNETIC WAVE DETECTION ELEMENT, ELECTROMAGNETIC WAVE SENSOR, ELECTRONIC APPARATUS, AND STRUCTURAL BODY

(71) Applicant: SONY CORPORATION, Tokyo (JP)

(72) Inventors: Shinji Imaizumi, Kanagawa (JP); Koji Kadono, Kanagawa (JP)

(73) Assignee: Sony Corporation, Toyko (JP)

( * ) Notice: Subject to any disclaimer, the term of this patent is extended or adjusted under 35 U.S.C. 154(b) by 0 days.

(21) Appl. No.: 16/329,909

(22) PCT Filed: Aug. 22, 2017

(86) PCT No.: PCT/JP2017/029892
§ 371 (c)(1),
(2) Date: Mar. 1, 2019

(87) PCT Pub. No.: WO2018/051739
PCT Pub. Date: Mar. 22, 2018

(65) Prior Publication Data
US 2019/0186989 A1      Jun. 20, 2019

(30) Foreign Application Priority Data
Sep. 13, 2016   (JP) .................. 2016-178340

(51) Int. Cl.
*G01J 5/00* (2006.01)
*G01J 1/44* (2006.01)
(Continued)

(52) U.S. Cl.
CPC ............. *G01J 1/44* (2013.01); *G01N 21/17* (2013.01); *H01L 27/1446* (2013.01);
(Continued)

(58) Field of Classification Search
CPC .. G01J 1/44; H01Q 1/38; H01Q 1/368; H01Q 5/22; H01L 31/08; H01L 31/102; H01L 31/028; H01L 27/1446; G01N 21/17
See application file for complete search history.

(56) References Cited

U.S. PATENT DOCUMENTS 8,981,345 B2 * 3/2015 Yu .................. G01N 27/127
                                              257/29
9,293,627 B1 * 3/2016 Beechem, III ...... H01L 29/1606
(Continued)

FOREIGN PATENT DOCUMENTS

| JP | 2010-206176 | 9/2010 |
| JP | 2015-045629 | 3/2015 |
| JP | 2016-025356 | 2/2016 |

OTHER PUBLICATIONS

Tamagnone et al., "Reconfigurable terahertz plasmonic antenna concept using a graphene stack," Applied Physics Letters, vol. 101, No. 214102, 2012, 5 pages.
(Continued)

*Primary Examiner* — Kiho Kim
(74) *Attorney, Agent, or Firm* — Sheridan Ross P.C.

(57) ABSTRACT

To provide an electromagnetic wave detection element capable of detecting an electromagnetic wave with an arbitrary wavelength and being miniaturized. An electromagnetic wave detection element according to the present technology includes an antenna unit and a detection unit. The antenna unit includes a first conductive layer, a first dielectric layer that is laminated on the first conductive layer and is constituted of a dielectric body, and a first graphene layer that is laminated on the first dielectric layer and is made of graphene. The detection unit includes a second conductive layer that is made of a conductive material and is separated from the first conductive layer, a second dielectric layer that is laminated on the second conductive layer and is consti-
(Continued)

tuted of a dielectric body, and a second graphene layer that is laminated on the second dielectric layer, is made of graphene, and is separated from the first graphene layer.

8 Claims, 18 Drawing Sheets

(51) Int. Cl.
| | | |
|---|---|---|
| *H01L 31/08* | (2006.01) | |
| *H01Q 1/38* | (2006.01) | |
| *G01N 21/17* | (2006.01) | |
| *H01Q 5/22* | (2015.01) | |
| *H01L 27/144* | (2006.01) | |
| *H01L 31/028* | (2006.01) | |
| *H01L 31/102* | (2006.01) | |
| *H01Q 1/36* | (2006.01) | |

(52) U.S. Cl.
CPC ............ *H01L 31/028* (2013.01); *H01L 31/08* (2013.01); *H01L 31/102* (2013.01); *H01Q 1/368* (2013.01); *H01Q 1/38* (2013.01); *H01Q 5/22* (2015.01)

(56) References Cited

U.S. PATENT DOCUMENTS

| | | | |
|---|---|---|---|
| 2010/0200755 A1 | 8/2010 | Kawano et al. | |
| 2013/0026442 A1* | 1/2013 | Kim | H01L 31/028 257/9 |
| 2013/0107344 A1* | 5/2013 | Avouris | H01L 31/0352 359/245 |
| 2014/0125322 A1 | 5/2014 | Lee et al. | |
| 2014/0162390 A1* | 6/2014 | Afzali-Ardakani | G01N 33/5438 438/49 |
| 2014/0319357 A1 | 10/2014 | Ogawa et al. | |
| 2015/0171167 A1* | 6/2015 | Nourbakhsh | H01L 29/1606 257/29 |
| 2016/0020280 A1 | 1/2016 | Heo et al. | |
| 2016/0093641 A1* | 3/2016 | Takahashi | H01L 27/1225 257/43 |
| 2016/0202505 A1* | 7/2016 | Wu | G02F 1/061 349/139 |
| 2016/0202613 A1* | 7/2016 | Di | G03F 7/16 345/173 |
| 2016/0380121 A1* | 12/2016 | Suzuki | H01L 31/028 385/2 |
| 2017/0025547 A1* | 1/2017 | Cho | H01L 29/78684 |
| 2019/0296178 A1* | 9/2019 | Bessonov | G01J 1/044 |

OTHER PUBLICATIONS

Vicarelli et al., "Graphene field-effect transistors as room-temperature terahertz detectors," Nature Materials, vol. 11, Oct. 2012, pp. 865-871.

International Search Report prepared by the Japan Patent Office dated Sep. 21, 2017, for International Application No. PCT/JP2017/029892.

* cited by examiner (a)

(b)

(c)

(d)

(a)

(b)

(c)

(d)

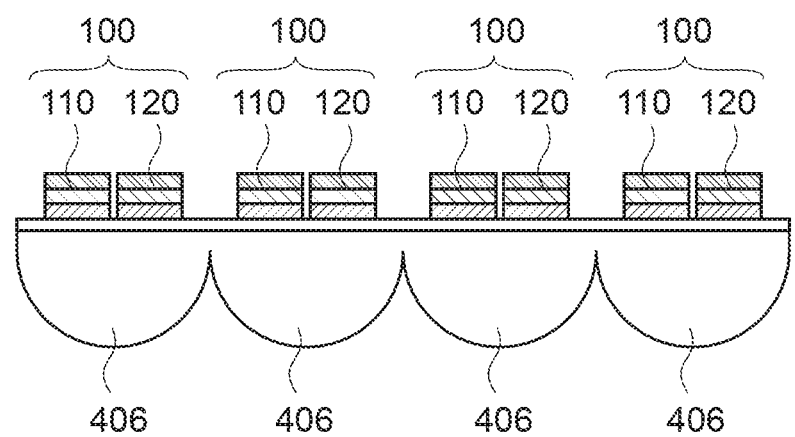

ELECTROMAGNETIC WAVE DETECTION ELEMENT, ELECTROMAGNETIC WAVE SENSOR, ELECTRONIC APPARATUS, AND STRUCTURAL BODY

CROSS REFERENCE TO RELATED APPLICATIONS

This application is a national stage application under 35 U.S.C. 371 and claims the benefit of PCT Application No. PCT/JP2017/029892 having an international filing date of 22 Aug. 2017, which designated the United States, which PCT application claimed the benefit of Japanese Patent Application No. 2016-178340 filed 13 Sep. 2016, the entire disclosures of each of which are incorporated herein by reference.

TECHNICAL FIELD

The present technology relates to an electromagnetic wave detection element capable of being used to detect an electromagnetic wave, an electromagnetic wave sensor, an electronic apparatus, and a structural body.

BACKGROUND ART

An antenna used to detect a broadband electromagnetic wave from a terahertz (THz) wave to a millimeter wave requires an antenna length of a half wavelength of an electromagnetic wave. Therefore, it is difficult to perform miniaturization of a broadband electromagnetic wave detection element in which antenna integration is achieved and perform modulation of a detection band.

In recent years, a metallic micro antenna has been proposed in which a Surface Plasmon Polariton (SPP) is used. However, a metallic surface has a low SPP propagation property due to an influence of electron scattering, and a band limit allowing the miniaturization is a near-infrared band, so the miniaturization of a broadband electromagnetic wave detection antenna for terahertz light or the like is difficult. Further, in the case where a metallic micro antenna is used, a detection band is also fixed depending on antenna sizes.

In contrast, graphene has a high carrier mobility and a high charge mean free path. As compared to another material, graphene is excellent in the SPP propagation property. Thus, it is known that the use of graphene theoretically achieves a submicron-order antenna size also in a THz band (IEEE 2013, 31, 685).

Further, the graphene has a peculiar band structure derived from a Dirac cone, so fine modulation can be performed for a carrier concentration. A graphene plasmon antenna has been proposed in which a plasmon resonance frequency is modulated by the carrier concentration modulation (see Non-Patent Literature 1).

Further, THz optical imaging has also been reported in which the graphene is used for an SPP transportation layer by a metallic antenna integrated FET (Field effect transistor)-type graphene THz sensor (see Non-Patent Literature 2).

CITATION LIST

Non-Patent Literature

Non-Patent Literature 1: Appl. Phys. Lett. 2012, 101, 2140
Non-Patent Literature 2: Nature Material 2012, 9, 865

DISCLOSURE OF INVENTION

Technical Problem

However, in the graphene plasmon antenna disclosed in Non-Patent Literature 1, a graphene antenna unit and an SPP detection unit are made of different materials, which causes a large influence of a propagation loss on a connection portion thereof. Further, the FFT-type THz sensor disclosed in Patent Literature 2, it is also difficult to perform miniaturization due to an influence of the antenna, and a detectable frequency band is fixed depending on an antenna size.

In view of the circumstances as described above, an object of the present technology is to provide an electromagnetic wave detection element, capable of detecting an electromagnetic wave having an arbitrary wavelength and achieving miniaturization, an electromagnetic wave sensor, an electronic apparatus, and a structural body.

Solution to Problem

To achieve the object described above, an electromagnetic wave detection element according to an embodiment of the present technology includes an antenna unit and a detection unit.

The antenna unit includes a first conductive layer made of a conductive material, a first dielectric layer that is laminated on the first conductive layer and is constituted of a dielectric body, a first graphene layer that is laminated on the first dielectric layer and is made of graphene, a second conductive layer that is made of a conductive material and is separated from the first conductive layer, a second dielectric layer that is laminated on the second conductive layer and is constituted of a dielectric body, and a second graphene layer that is laminated on the second dielectric layer, is made of graphene, and is separated from the first graphene layer.

The detection unit includes the second conductive layer that is made of a conductive material and is separated from the first conductive layer, a second dielectric layer that is laminated on the second conductive layer and is constituted of a dielectric body, and a second graphene layer that is laminated on the second dielectric layer, is made of graphene, and is separated from the first graphene layer.

With this configuration, when an electromagnetic wave such as a terahertz wave reaches the first graphene layer, on the first graphene layer, SPP (Surface Plasmon Polariton) is generated, and is propagated to the second graphene layer by a mutual action of plasmon generated in the first and second graphene layers, respectively. By applied voltages to the first conductive layer and the second conductive layer, it is possible to control a resonance frequency of the SPP, that is, the frequency of the electromagnetic wave to be detected.

The first graphene layer and the second graphene layer may be each constituted of an atomic monolayer of graphene.

The graphene has a carrier mobility, and involves a small attenuation of the SPP, and thus can achieve resonance with the electromagnetic wave in a terahertz band.

The first graphene layer and the second graphene layer each may have a nanoribbon shape that is extended along a direction in which the first graphene layer and the second graphene layer are separated from each other.

By causing the first graphene layer and the second graphene layer to have the nanoribbon shape, it is possible to give directionality to a propagation direction of the SPP, and achieve improvement of an antenna gain in the resonance frequency of the SPP and a reduction in size.

A distance between the first graphene layer and the second graphene layer may be equal to or less than 5 μm.

If the distance between the first graphene layer and the second graphene layer is more than 5 μm, an influence by the mutual action of the plasmon between the graphene layers is reduced. Thus, it is preferable that the distance be equal to or less than 5 μm.

The first electrode layer may be connected to a first gate power supply, the second electrode layer may be connected to a second gate power supply, and the first graphene layer and the second graphene layer may be connected to an operational amplifier that outputs a potential difference between the first graphene layer and the second graphene layer.

With this configuration, by an applied voltage to the first conductive layer (first gate), a charge density of the first graphene layer can be controlled, and by an applied voltage to the second conductive layer (second gate), a charge density of the second graphene layer can be controlled. As a result, it is possible to modulate an SPP resonance frequency on each of the first and second graphene layers independently.

To achieve the object described above, an electromagnetic wave sensor according to an embodiment of the present technology includes an antenna unit, a detection unit, and a signal processing circuit.

The antenna unit includes a first conductive layer made of a conductive material, a first dielectric layer that is laminated on the first conductive layer and is constituted of a dielectric body, and a first graphene layer that is laminated on the first dielectric layer and is made of graphene.

The detection unit includes a second conductive layer that is made of a conductive material and is separated from the first conductive layer, a second dielectric layer that is laminated on the second conductive layer and is constituted of a dielectric body, and a second graphene layer that is laminated on the second dielectric layer, is made of graphene, and is caused to face the first graphene layer with a predetermined interval therebetween.

The signal processing circuit uses the first conductive layer as a first gate, the second conductive layer as a second gate, the first graphene layer as a source, and the second graphene layer as a drain, and outputs a potential difference between the source and the drain.

To achieve the object described above, an electronic apparatus according to an embodiment of the present technology includes an electromagnetic wave sensor.

The electromagnetic wave sensor includes an antenna unit including a first conductive layer made of a conductive material, a first dielectric layer that is laminated on the first conductive layer and is constituted of a dielectric body, and a first graphene layer that is laminated on the first dielectric layer and is made of graphene, a detection unit including a second conductive layer that is made of a conductive material and is separated from the first conductive layer, a second dielectric layer that is laminated on the second conductive layer and is constituted of a dielectric body, and a second graphene layer that is laminated on the second dielectric layer, is made of graphene, and is caused to face the first graphene layer with a predetermined interval therebetween, and a signal processing circuit that uses the first conductive layer as a first gate, the second conductive layer as a second gate, the first graphene layer as a source, and the second graphene layer as a drain, and outputs a potential difference between the source and the drain.

To achieve the object described above, a structural body according to an embodiment of the present technology includes an antenna unit and a detection unit.

The antenna unit includes a first conductive layer made of a conductive material, a first dielectric layer that is laminated on the first conductive layer and is constituted of a dielectric body, a first graphene layer that is laminated on the first dielectric layer and is made of graphene, a second conductive layer that is made of a conductive material and is separated from the first conductive layer, a second dielectric layer that is laminated on the second conductive layer and is constituted of a dielectric body, and a second graphene layer that is laminated on the second dielectric layer, is made of graphene, and is caused to face the first graphene layer with a predetermined interval therebetween.

The detection unit includes the second conductive layer, a second dielectric layer that is laminated on the second conductive layer and is constituted of a dielectric body, and a second graphene layer that is laminated on the second dielectric layer, is made of graphene, and is caused to face the first graphene layer with a predetermined interval therebetween.

Advantageous Effects of Invention

As described above, according to the present technology, it is possible to provide an electromagnetic wave detection element capable of detecting an electromagnetic wave in an arbitrary frequency band and being miniaturized, an electromagnetic wave sensor, an electronic apparatus, and a structural body. It should be noted that the effects described herein are not necessarily limited, any effect described herein may be obtained.

BRIEF DESCRIPTION OF DRAWINGS

FIG. 22 A schematic view of an imaging element which uses the electromagnetic wave detection element.

MODE(S) FOR CARRYING OUT THE INVENTION

[Configuration of Structural Body]

Figure 1:
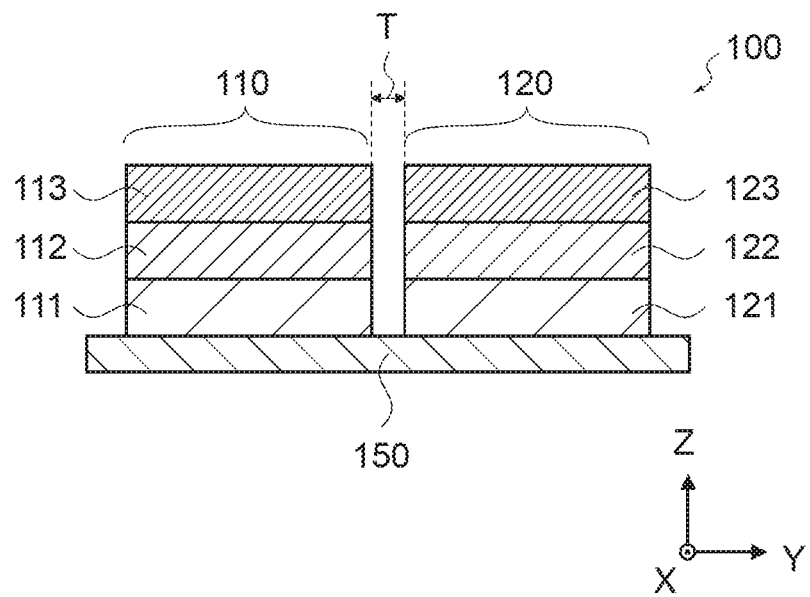
FIG. 1 A plan view showing a structural body according to an embodiment of the present technology.
Figure 2:
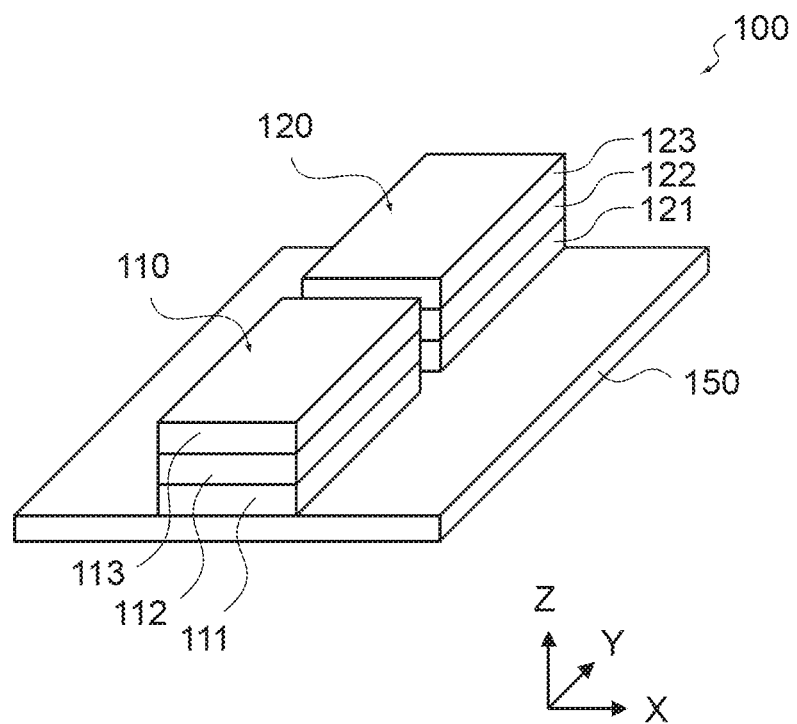
FIG. 2 A perspective view showing the structural body.

A structural body according to this embodiment will be described. FIG. 1 is a cross-sectional view showing a structural body 100 according to this embodiment, and FIG. 2 is a perspective view showing the structural body 100. It should be noted that in the figures described below, three directions orthogonal to one another are set as an X direction, a Y direction, and a Z direction, respectively.

As shown in FIG. 1 and FIG. 2, the structural body 100 includes an antenna unit 110 and a detection unit 120. The antenna unit 110 and the detection unit 120 are provided on a substrate 150.

The antenna unit 110 includes a conductive layer 111, a dielectric layer 112, and a graphene layer 113.

The conductive layer 111 is a layer made of a conductive material, and is laminated on the substrate 150. The conductive layer 111 is an Au deposition film, for example. A thickness of the conductive layer 111 is not particularly limited and can be 100 Å, for example.

The dielectric layer 112 is a layer made of a dielectric body, and is laminated on the conductive layer 111. The dielectric body that constitutes the dielectric layer 112 can be h-BN (hexagonal boron nitride), $Al_2O_3$, $HfO_2$, SiO, $La_2O_3$, $SiO_2$, STO, $Ta_2O_5$, $TiO_2$, ZnO, or the like. A thickness of the dielectric layer 112 is not particularly limited and can be approximately 5 to 10 nm, for example.

The graphene layer 113 is a layer made of graphene and is laminated on the dielectric layer 112. The graphene layer 113 is preferably made of graphene having an atomic monolayer. A thickness of the graphene layer 113 is approximately 0.3 nm in the case where the graphene layer 113 is made of graphene having the atomic monolayer. As shown in FIG. 2, the graphene layer 113 is orientated in one direction (Y direction) and can have a nanoribbon shape. It is preferable that a length (Y direction) of the graphene layer 113 be equal to or less than 5 μm, and a width (X direction) of the graphene layer 113 is equal to or less than 100 nm.

A detection unit 120 includes a conductive layer 121, a dielectric layer 122, and a graphene layer 123.

The conductive layer 121 is a layer made of a conductive material and is laminated on the substrate 150. The conductive layer 121 is an Au deposition film, for example. A thickness of the conductive layer 121 is not particularly limited and can be 100 Å, for example.

The dielectric layer 122 is a layer formed of a dielectric body and is laminated on the conductive layer 121. The dielectric body that forms the dielectric layer 112 can be h-BN (hexagonal boron nitride), $Al_2O_3$, $HfO_2$, SiC, $La_2O_3$, $SiO_2$, STO, $Ta_2O_5$, $TiO_2$, ZnO, or the like. A thickness of the dielectric layer 122 is not particularly limited and can be approximately 5 to 10 nm, for example.

The graphene layer 123 is a layer made of graphene and is laminated on dielectric layer 122. The graphene layer 123 is preferably made of graphene having an atomic monolayer. A thickness of the graphene layer 123 is approximately 0.3 nm in the case where the graphene layer 123 is made of layer graphene having the atomic monolayer. As shown in FIG. 2, the graphene layer 123 is oriented in one direction (Y direction) and can have a nanoribbon shape. It is preferable that length (Y direction) of the graphene layer 123 be equal to or less than 5 μm, and a width (X direction) of the graphene layer 123 be equal to or less than 100 nm.

As described above, the antenna unit 110 and the detection unit 120 can have the same structures. Although details will be described later, the respective layers of the antenna unit 110 and the detection unit 120 can be formed by separating one layer created in the same process. It should be noted that the antenna unit 110 and the detection unit 120 may not necessarily have the same structure.

The antenna unit 110 and the detection unit 120 are separated in the Y direction on the substrate 150. As shown in FIG. 1, A gap between the antenna unit 110 and the detection unit 120 is set as a gap T. It is preferable that a width of the gap T, that is, a distance between the antenna unit 110 and the detection unit 120 be equal to or less than 5 μm. The conductive layer 111 and the conductive layer 121, the dielectric layer 112 and the dielectric layer 122, the graphene layer 113 and the graphene layer 123 respectively have the same thickness, and are caused to face each other with gap T intervened therebetween.

Figure 9:
FIG. 9 A schematic view showing a manufacturing process according to a manufacturing method 2 of the structural body.
Figure 9:
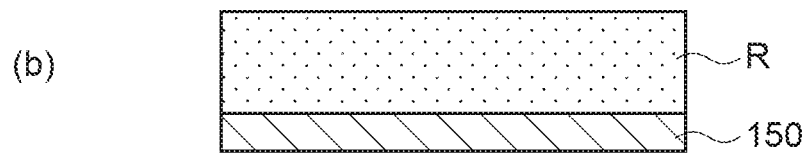
Figure 9:
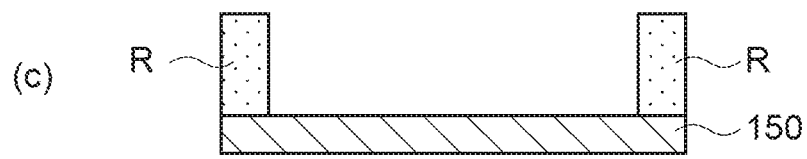
Figure 9:
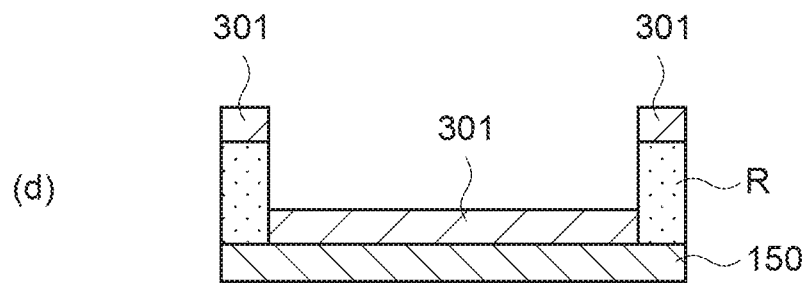

It should be noted that the dielectric layer 112 and the dielectric layer 122 may be one continuous layer without being separated (see FIG. 9). Such a configuration that at least the conductive layer 111 and the conductive layer 121 are separated, and the graphene layer 113 and the graphene layer 123 are separated only has to be provided. Further, a distance between the conductive layer 111 and the conductive layer 121 and a distance between the graphene layer 113 and the graphene layer 123 do not have to be the same. In this case, it is also preferable that the distance between the graphene layer 113 and the graphene layer 123 be equal to or less than 5 μm.

It should be noted that the gap T may be a space, and the dielectric body may be embedded therein.

[Configuration of Electromagnetic Wave Detection Element]

Figure 3:
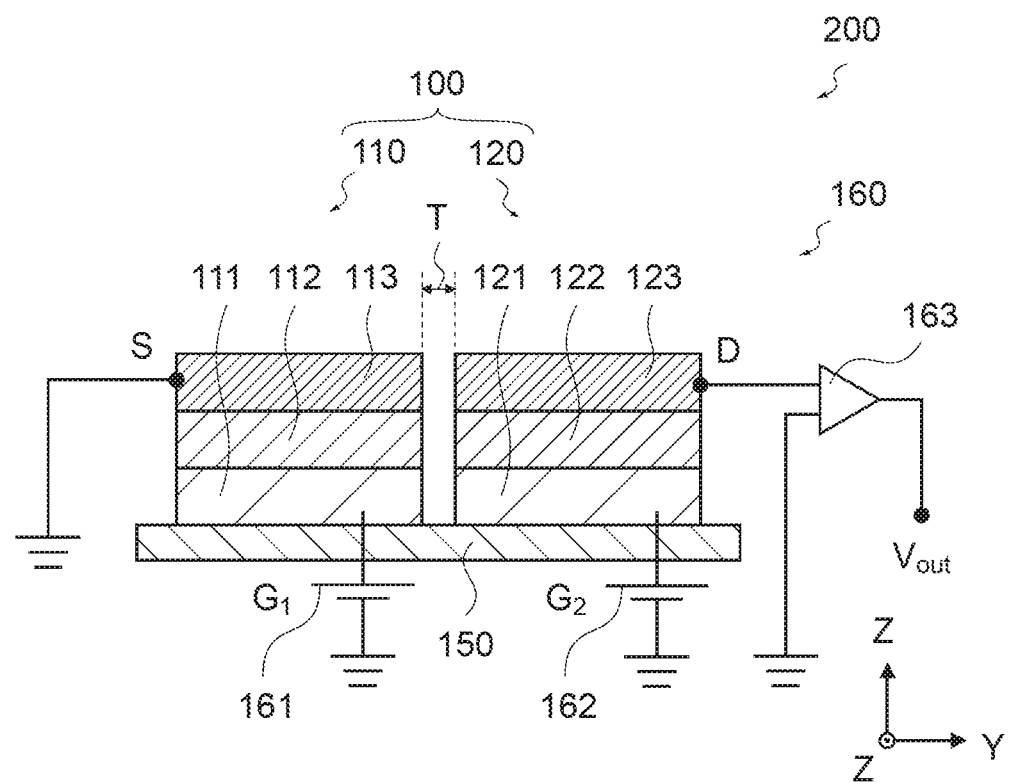
FIG. 3 A plan view showing an electromagnetic wave detection element according to the embodiment of the present technology.
Figure 4:
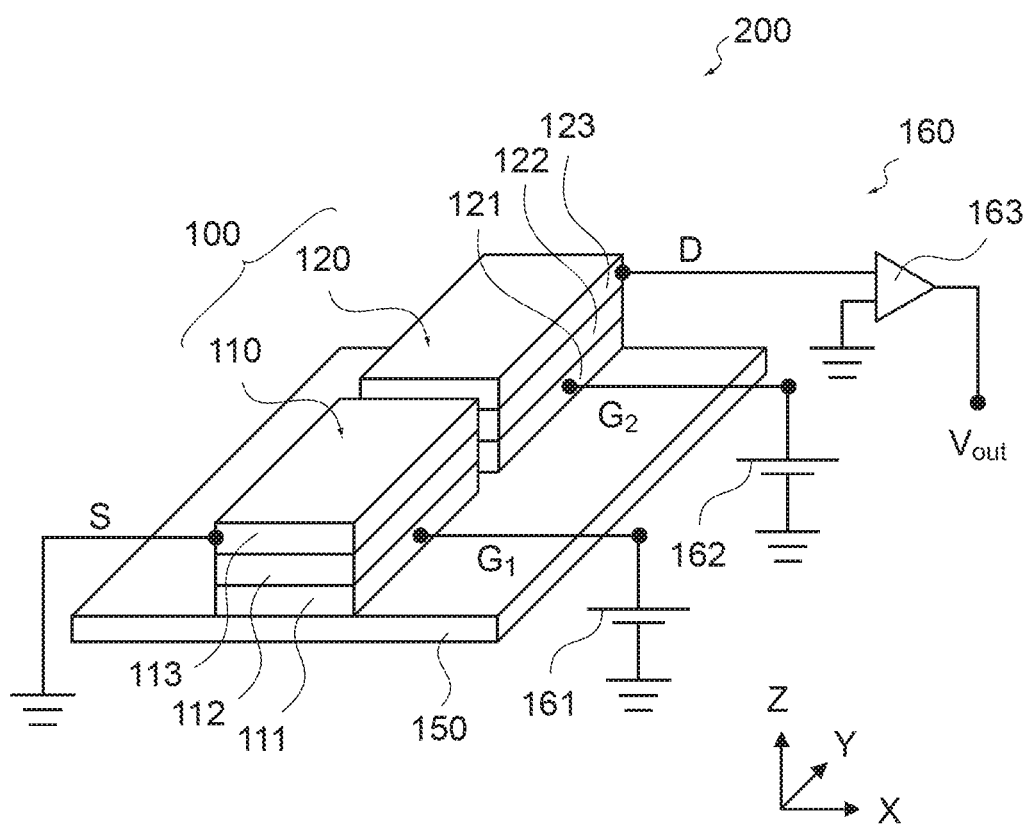
FIG. 4 A perspective view showing the electromagnetic wave detection element.

By using the structural body 100 described above, it is possible to achieve an electromagnetic wave detection element. FIG. 3 is a cross-sectional view of an electromagnetic wave detection element 200 using the structural body 100. FIG. 4 is a perspective view showing the electromagnetic wave detection element 200.

As shown in the figures, the electromagnetic wave detection element 200 is configured by the structural body 100 and a signal processing circuit 160. The signal processing circuit 160 is provided with a gate power source 161, a gate power source 162, and an operational amplifier 163.

The gate power source 161 is connected to the conductive layer 111 and applies a gate voltage to the conductive layer 111. The gate power source 162 is connected to the conductive layer 121 and applies a gate voltage to the conductive layer 121. The operational amplifier 163 is connected to the graphene layer 113 and the graphene layer 123, and amplifies and outputs a potential difference between the graphene layer 113 and the graphene layer 123.

By the signal processing circuit 160 as described above, the conductive layer 111 and the conductive layer 121 function as gates (G1, G2 in the figure) independent of each other. Further, the graphene layer 113 functions as a source (S in the figure), and the graphene layer 123 functions as a drain (D in the figure).

[About Detection of Electromagnetic Wave by Electromagnetic Wave Sensor]

Figure 5:
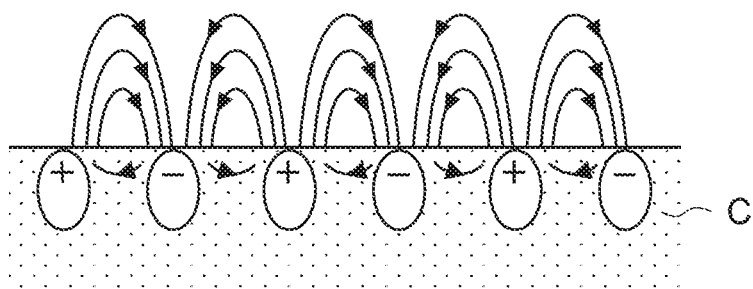
FIG. 5 A schematic view showing a principle of an SPP.

The electromagnetic wave detection element 200 detects an electromagnetic wave by using Surface Plasmon Polariton (SPP). FIG. 5 is a schematic view showing the SPP. As shown in the figure, when the electromagnetic wave reaches a surface of a conductive body C, a compressional wave of a charge forms a longitudinal wave of an electrical field on a surface of the conductive body C, and a resonance phenomenon (SPP) with the electromagnetic wave is caused. In the SPP, energy of the electromagnetic wave can be confined in a finer configuration than a wavelength.

In the electromagnetic wave detection element 200, voltages at the gate $G_1$ and the gate $G_2$ are controlled, with the result that charge densities on the surfaces of the graphene layer 113 and the graphene layer 123 can be independently modulated, and the resonance frequency on the SPP can be controlled. The SPP that is propagated on the graphene layer 113 causes a phenomenon (plasmon coupling) due to a mutual action with the graphene layer 123 through the gap T, and propagated to the graphene layer 123. As a result, on the basis of a potential difference between the source (S) and the drain (D) or a current displacement, displacement of a capacitance, light emission displacement, amplitude of an AC signal, or a phase change, the electromagnetic wave that reaches the electromagnetic wave detection element 200 can be detected.

It should be noted that the graphene layer 113 and the graphene layer 123 are caused to have the nanoribbon shape, with the result that it is possible to give directionality to the propagation direction of the SPP and achieve improvement of an antenna gain in a resonance frequency and a size reduction.

Further, it is preferable that the distance (width of gap T) between the graphene layer 113 and the graphene layer 123 is equal to or less than 5 µm. This is because a distance longer than 5 µm leads to a reduction in influence by the plasmon mutual action between the graphene layers. Further, if the distance is equal to or less than 1 nm, a tunneling current is generated, so such a distance that does not cause the tunneling current is preferable.

[About Electromagnetic Wave Detection Technology]

A description will be given on various antennas to be used to detect an electromagnetic wave in a millimeter waveband from an infrared band.

At a time when an electromagnetic wave (including light) in a millimeter waveband from a far infrared band, a use of an antenna structure using a general dielectric current requires a size approximately half of a detection wavelength, and thus a size reduction is difficult. For example, an antenna length necessary to receive an electromagnetic wave of 300 GHz is approximately 500 mm. An antenna length necessary to receive an electromagnetic wave of 30 THz is approximately 5 µm.

Here, such a principle verification has been reported that an antenna structure using metal Surface Plasmon Polariton (SPP) can be miniaturized up to approximately ¹⁄₁₀ of a wavelength in the infrared band. However, in the metal, an SPP attenuation rate is large due to an influence of electron scattering, and a Light transmittance in a broadband is low. For these reasons, a band which allows a stable antenna gain to be obtained is a near-infrared band as a limit (nanoantenna achievable band: >100 THz). Further, a detectable wavelength band is decided depending on an antenna size, so an arbitrary change cannot be performed.

As an antenna structure using the SPP, an FET antenna structure (Nature Material 2012, 9, 865) has been reported. The antenna structure is obtained by disposing antennas made of Au at a source, a drain, and a gate electrode, and bonding the source and the drain with a transport layer made of graphene. A plasma oscillation generated on the antenna is caused to be subjected to coupling with the SPP of graphene, thereby improving a light collection efficiency. A graphene charge density is modulated from the gate electrode, thereby performing impedance control.

In the structure, a light detection band is fixed by an antenna size, and a gain loss at a time of coupling is large in SPP propagation of graphene and the plasma oscillation generated in the antenna unit, and an SPP propagation loss due to a surface phonon scattering caused on the transport layer is also large.

Further, as another antenna structure using the SPP, a graphene nanoantenna (IEEE 2013) has been reported. This antenna uses a SPP propagation characteristic on a graphene surface, and an antenna gain equal to a metal antenna having a length of approximately 100 µm (approximately 3 THz) can be achieved by a length of 1 µm (antenna size 1/100).

As compared to a traveling velocity of a THz radio wave (photon), an SPP group velocity is lower by double digits, so a mutual action length of the graphene and THz photon is increased by double digits, with the result that an antenna gain is enhanced. Further, because of a high mobility characteristic due to a Dirac cone band structure of the graphene, an SPP propagation distance is long, so resonance can be achieved on the graphene even with a radio wave having a long wavelength. In addition, by chemical doping, a charge density of the graphene can be modulated, and a resonance frequency can be controlled. The graphene is caused to have a ribbon shape, thereby controlling propagation directionality, and SPP oscillation amplitude is increased.

In this report, only the electromagnetic wave by the antenna and the resonance of plasmon are mentioned, and a signal extraction is not mentioned. In this structure, at a time when the SPP generated in the antenna unit is propagated to a detection unit, a gain loss is generated. Further, in the case of the chemical doping, the charge density of the graphene is fixed, so an arbitrary resonance frequency modulation is difficult. As a result, an absorption by a dopant, a dispersion loss is generated, and an antenna gain is also reduced.

In addition, a frequency modulation element using plasmon resonance has also been reported (see, Japanese Patent Application Laid-open No. 2015-175957). In the frequency modulation element, a layer structure which includes an antenna, a graphene layer, an insulation layer, a graphene layer, and an antenna, and is a frequency variable filter that is operated in a THz band used in an optical/wireless communication system, and for incident light from above, filtering of an arbitrary frequency is performed, to radiate the light from a lower antenna.

When the incident light generates resonance plasma at an upper antenna electrode unit, in a plasmon propagation layer of graphene, a plasmon resonance frequency between double graphene layers is controlled, causing the frequency to be coincide with a resonant tunneling frequency, with the result that a tunneling current generated between barrier layers can be increased.

In this structure, a loss at a time of tunneling current transmission is large, a difficulty of a manufacturing process is significant, an electric field consistency at upper and lower antenna gate electrodes has to be achieved. Further, by a metal antenna, a plasma frequency is limited. Therefore, a size reduction is difficult, and a gain loss due to a contact resistance at a time of coupling of the graphene layer and resonance plasma generated at the antenna unit is large. In addition, by the lower gate electrode, it is necessary to periodically modulate the carrier concentration.

In addition, a plasmon antenna using a graphene lamination structure has also been reported (see, Appl. Phys. Lett. 2012, 101, 2140). This antenna is a frequency variable antenna that is operated in a THz band and has a bipolar graphene antenna structure. The antenna detects, with a photo mixer, a change in impedance of a graphene unit changed due to an electromagnetic wave resonance of an SPP in the graphene unit. It has been reported that, by modulating a carrier concentration of the graphene, the resonance frequency can be modulated.

In this report, there no specific reference to a signal extraction unit. Material, structure, circuit plans, and the like of a photo mixer unit, and a specific means for performing the carrier concentration modulation have not been described. In this structure, a gain loss is caused at a time when an SPP generated in an antenna unit is propagated to the photo mixer unit, and a difficulty of a manufacturing process is slightly high.

As described above, such a technology exists that by using the SPP to detect the electromagnetic wave, the resonance frequency of the SPP is adjusted, and the frequency of the electromagnetic wave to be received is selected. However, a method and a structure to guide the SPP generated in the antenna to a detection unit with a small propagation loss have to be studied.

[Effects by Present Technology]

As described above, in the electromagnetic wave detection element 200 according to the present technology, by controlling the voltages at the gate $G_1$ and gate $G_2$, the charge density on the surfaces of the graphene layer 113 and the graphene layer 123 is modulated, and the SPP is guided to the detection unit 120 by the plasmon coupling.

Because both of the graphene layer 113 and the graphene layer 123 are made of graphene, a coupling loss at a time of plasmon propagation is small, and thus it is possible to detect the electromagnetic wave with higher accuracy. As compared to an electromagnetic wave detection based on an optical transition of the electromagnetic wave, it is possible to obtain a higher gain by double digits by using the plasmon resonance.

Further, it is possible to control, by the voltages at the gate $G_1$ and the gate $G_2$, the resonance frequency of the SPP, that is, the frequency of the electromagnetic wave to be received can be controlled. It is possible to detect an electromagnetic wave in a broad wavelength band of hundreds of GHz to tens of THz with a specific structure element.

In addition, as compared to a conventional metal antenna, it is possible to reduce the antenna size by double digits. Thus, the sensor can be markedly miniaturized (tens of nm*several μm). Further, by using a signal extraction by the SPP propagation, a sensitivity can be obtained even in a carrier transport noise due to thermal fluctuation, so a room temperature operation can be performed without a cooling mechanism.

In addition, because the antenna unit and the detection unit are formed of the same material, which is graphene having the high plasmon propagation property, a contact resistance loss is small, which is excellent in responsibility. Further, by controlling a content with a back gate type, there is no incident electromagnetic wave loss by a top gate or a dopant, so an increase in sensitivity can be achieved.

In a manufacturing method to be described later, except a transfer of the graphene, an element can be formed by an existing silicon process, and a complicated lamination structure like a quantum well structure of a compound semiconductor is not required, so manufacturing can be easily performed.

[About Method of Manufacturing Structural Body]

The structural body 100 can be manufactured as follows.

(Manufacturing Method 1)

Figure 6:
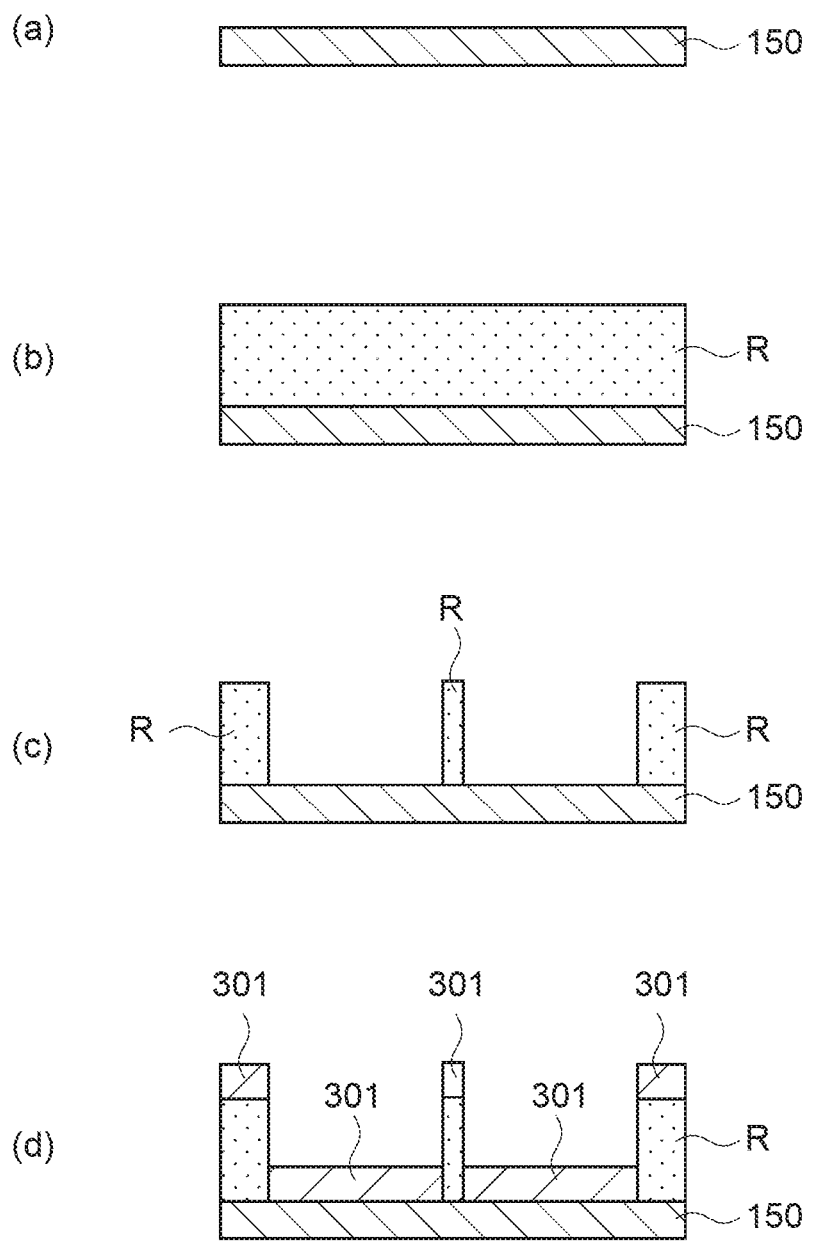
FIG. 6 A schematic view showing a manufacturing process according to a manufacturing method 1 of the structural body according to the embodiment of the present technology.
Figure 7:
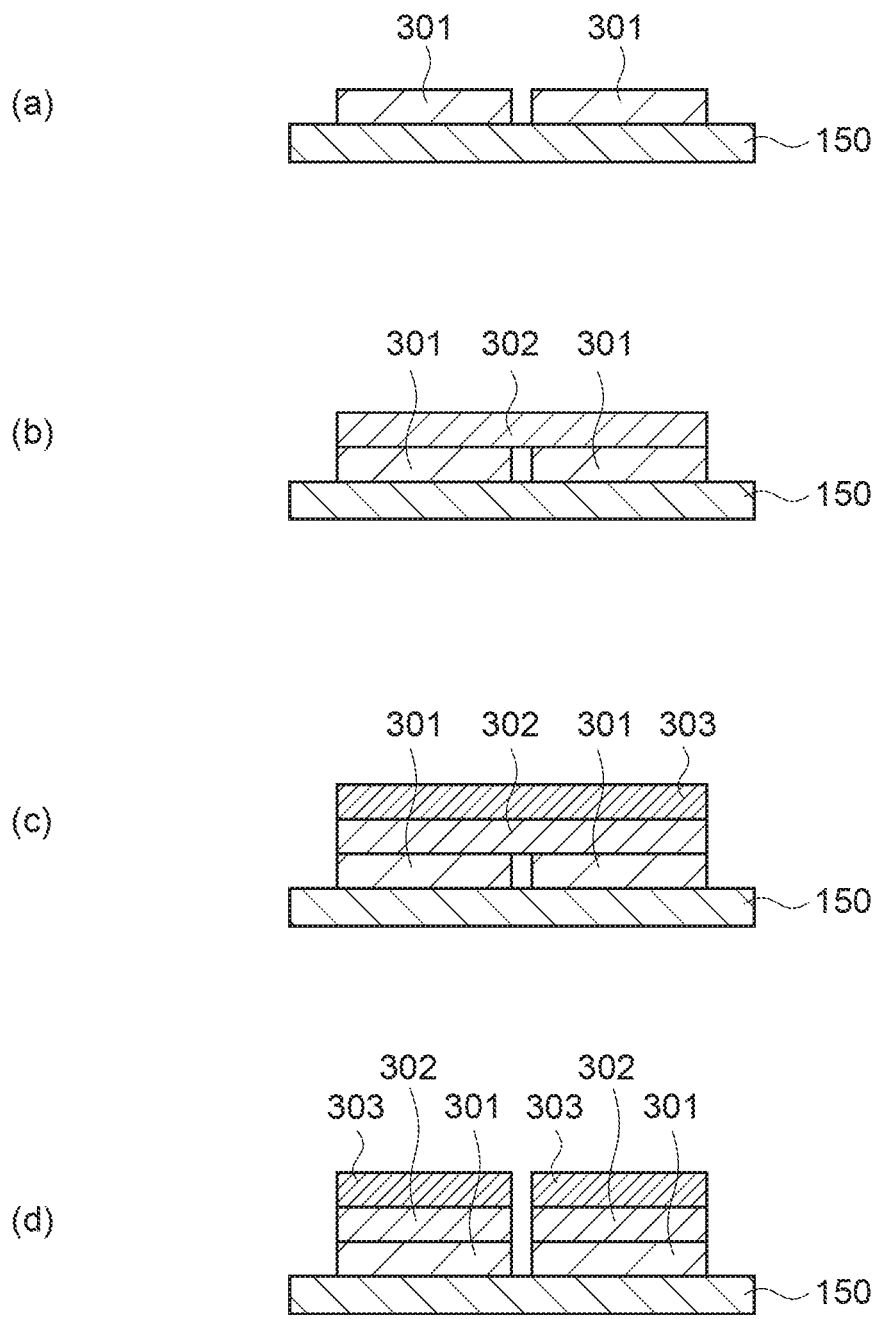
FIG. 7 A schematic view showing a manufacturing process according to the manufacturing method 1 of the structural body.
Figure 8:
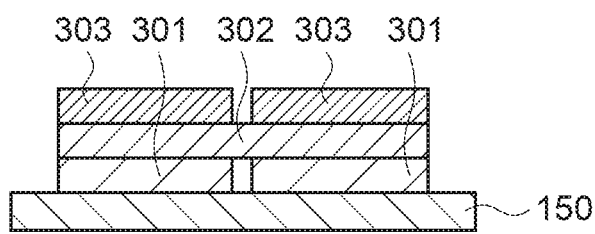
FIG. 8 A schematic view showing a manufacturing process according to the manufacturing method 1 of the structural body.

FIG. 6 to FIG. 8 are schematic views each showing a manufacturing process of a manufacturing method 1 of the structural body 100.

As shown in FIG. 6(a), the substrate 150 is prepared, and as shown in FIG. 6(b), on the substrate 150, a photosensitive resist film R is formed. The resist film R can be formed by spin coating, and a thickness thereof can be set to approximately 100 to 200 nm. Conditions of the spin coating are, for example, rotation speed of 3000 rpm, a duration time of 30 sec, and performing thermal treatment at 180° C. for 3 minutes immediately after coating.

Subsequently, a photo mask is disposed, and exposure is performed. Exposure conditions are, for example, an irradiation output of 40 mJ/sec and an irradiation time of 2.5 sec. After the exposure, the substrate 150 is immersed in a developer, and as shown in FIG. 6(c), a patterning portion of the resist film R is removed. An immersion time is 50 sec, for example. After that, washing and drying are performed.

Subsequently, as shown in FIG. 6(d), the conductive layer 301 is laminated. For example, the conductive layer 301 can be laminated by evaporation. Lamination conditions are, for example, an evaporation speed of 5 Å/sec, and an evaporation time of 20 sec.

Subsequently, lifting off is performed by using an organic solvent or the like, and as shown in FIG. 7(a), the resist film R is removed. As the organic solvent, cyclopentanone, acetone, isopropyl alcohol, or the like can be used. After that, washing and drying are performed. As a result, on the substrate 150, the conductive layer 301 having the ribbon shape is formed.

Subsequently, as shown in FIG. 7(b), on the conductive layer 301, a dielectric layer 302 is laminated. The dielectric layer 302 is, for example, h-EN (hexagonal boron nitride), and can be laminated by a dry type transfer. A thickness of the dielectric layer 302 can be set to approximately 10 nm.

Subsequently, as shown in FIG. 7(c), on the dielectric layer 302, a graphene layer 303 is laminated. The graphene layer 303 can be laminated by a dry type transfer, for example. The graphene can be deposited by heating a support body such as a copper foil, and supplying a carbon source gas to a surface of the support body, and the graphene layer 303 can be obtained by transferring the graphene.

Subsequently, as shown in FIG. 7(d), the graphene layer 303 and the dielectric layer 302 are separated. This process can be performed by ion beam lithography or reactive ion etching. An irradiation condition is approximately 350 W, for example.

In the way described above, it is possible to manufacture the structural body 100. It should be noted that the conductive layer 301 corresponds to the conductive layer 111 and the conductive layer 121, and the dielectric layer 302 corresponds the dielectric layer 112 and the dielectric layer 122, and the graphene layer 303 corresponds to the graphene layer 113 and the graphene layer 123, respectively.

It should be noted that, instead of separating the graphene layer 303 and the dielectric layer 302, as shown in FIG. 8, only the graphene layer 303 may be separated.

(Manufacturing Method 2)

Figure 10:
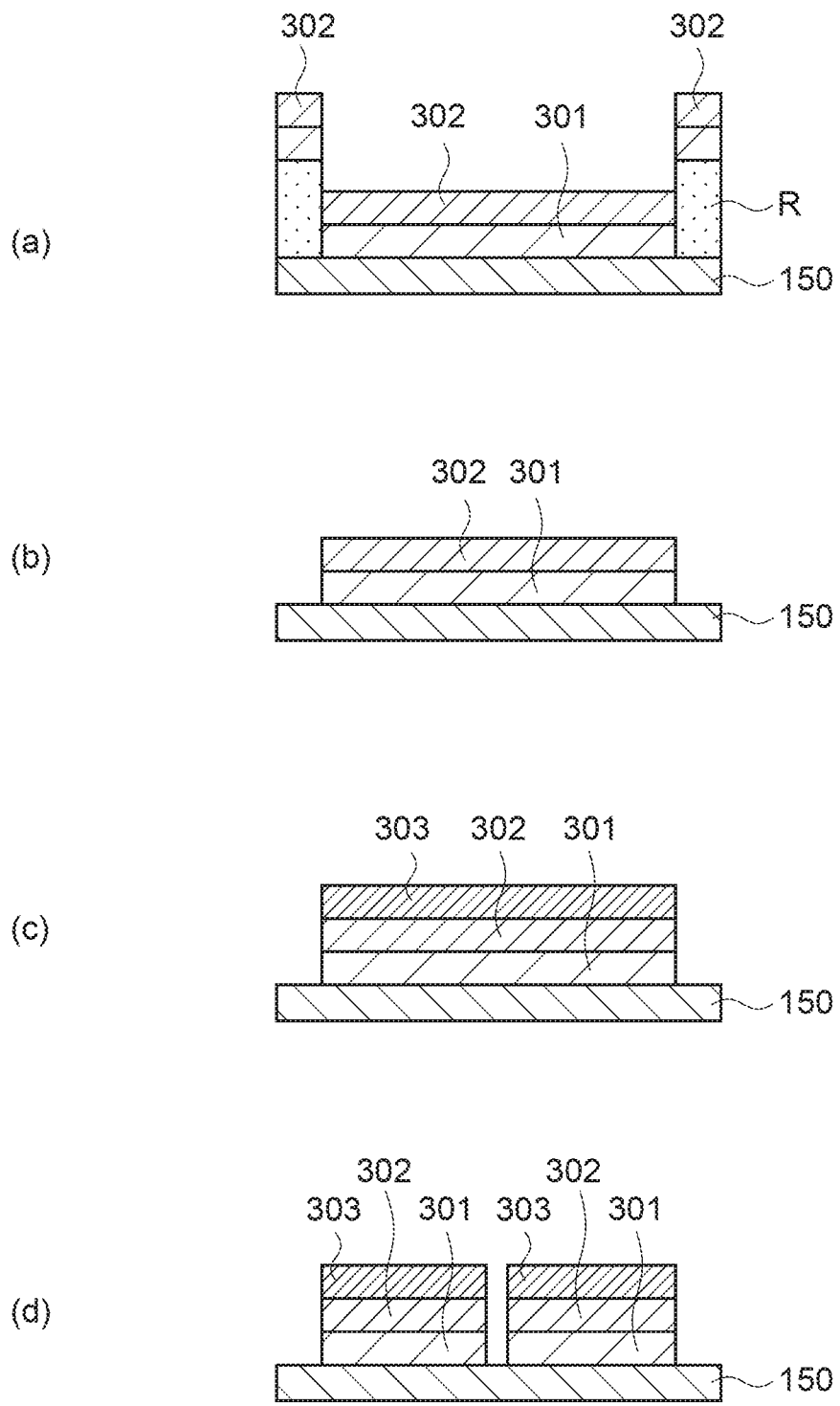
FIG. 10 A schematic view showing a manufacturing process according to the manufacturing method 2 of the structural body.

FIG. 9 and FIG. 10 are schematic views each showing a manufacturing process of a manufacturing method 2 of the structural body 100.

As shown in FIG. 9(a), the substrate 150 is prepared, and as shown in FIG. 9(b), on the substrate 150, the photosensitive resist film R is formed. The resist film R can be formed by spin coating, and a thickness thereof can be set to approximately 100 to 200 nm. Conditions of the spin coating are, for example, a rotation speed of 3000 rpm, a duration time of 30 sec, and performing a thermal treatment at 180° C. for 3 minutes immediately after coating.

Subsequently, a photo mask is disposed, and exposure is performed. Exposure conditions are, for example, an irradiation output of 40 mJ/sec and an irradiation time of 2.5 sec. After the exposure, the substrate 150 is immersed in a developer, and as shown in FIG. 9(c), a patterning portion of the resist film R is removed. An immersion time is 50 sec, for example. After that, washing and drying are performed.

Subsequently, as shown in FIG. 9(d), the conductive layer 301 is laminated. The conductive layer 301 can be laminated by evaporation, for example. Lamination conditions are, for example, an evaporation speed of 5 Å/sec, and an evaporation time of 20 sec.

Subsequently, as shown in FIG. 10(a), on the conductive layer 301, the dielectric layer 302 is laminated. The dielectric layer 302 is, for example, $Al_2O_3$, $HfO_2$, SiO, $La_2O_3$, $SiO_2$, STO, $Ta_2O_5$, $TiO_2$, ZnO, or the like, and can be laminated by an atomic layer deposition method. A thickness of the dielectric layer 302 can be set to 5 nm, and a deposition temperature thereof can be set to 200° C.

Subsequently, lifting off is performed by using an organic solvent or the like, and as shown in FIG. 10(b), the resist film R is removed. As the organic solvent, cyclopentanone, acetone, isopropyl alcohol, or the like can be used. After that, washing and drying are performed. As a result, on the substrate 150, the conductive layer 301 and the dielectric layer 302 having a ribbon shape are formed.

Subsequently, as shown in FIG. 10(c), on the dielectric layer 302, the graphene layer 303 is laminated. The graphene layer 303 can be laminated by a dry type transfer, for example. The graphene can be deposited by heating a support body such as a copper foil, and supplying a carbon source gas to a surface of the support body. The graphene layer 303 can be obtained by transferring the graphene.

Subsequently, as shown in FIG. 10(d), the graphene layer 303, the dielectric layer 302, and the conductive layer 301 are separated. This process can be performed by ion beam lithography or reactive ion etching. An irradiation condition is approximately 350 W, for example.

In the way described above, it is possible to manufacture the structural body 100. It should be noted that the conductive layer 301 corresponds to the conductive layer 111 and the conductive layer 121, the dielectric layer 302 corresponds to the dielectric layer 112 and the dielectric layer 122, and the graphene layer 303 corresponds to the graphene layer 113 and the graphene layer 123, respectively.

(Manufacturing Method 3)

Figure 11:
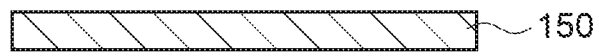
FIG. 11 A schematic view showing a manufacturing process according to a manufacturing method 3 of the structural body.
Figure 11:
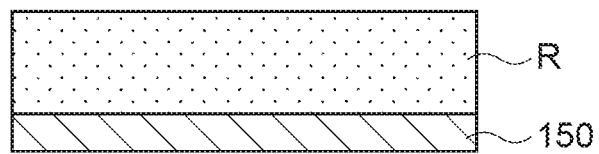
Figure 11:
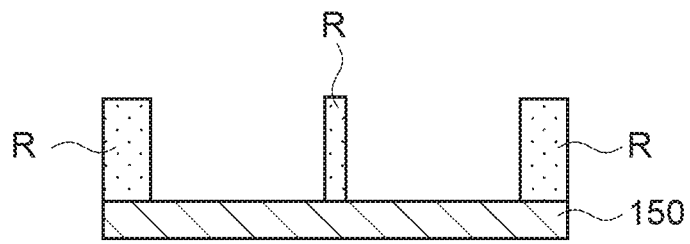
Figure 11:
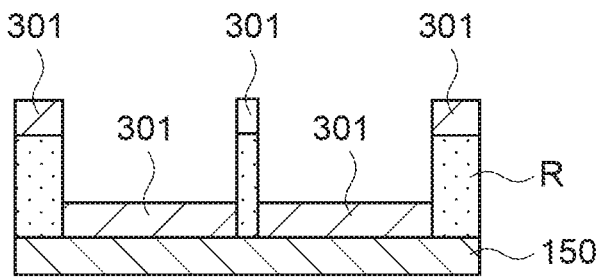
Figure 12:
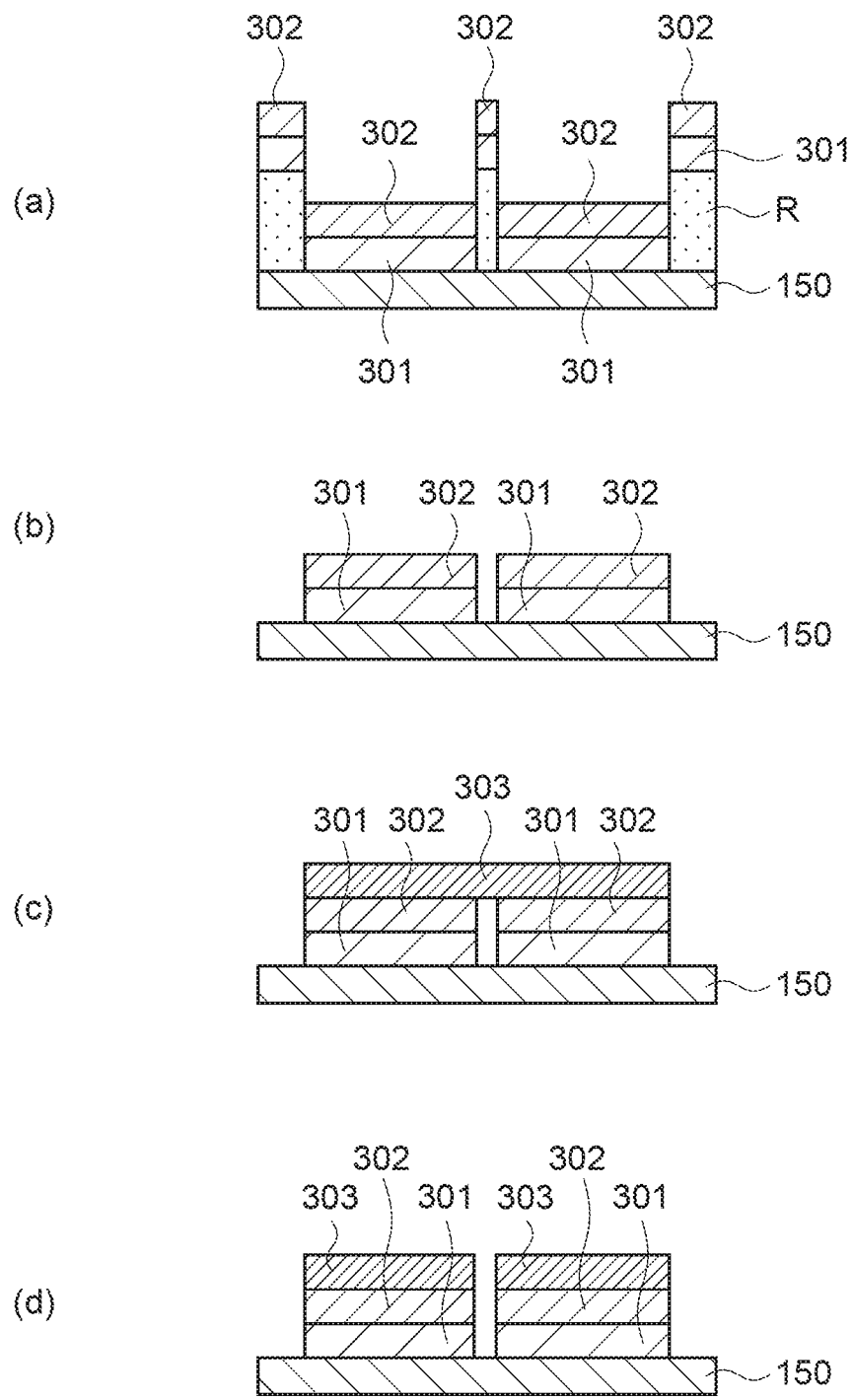
FIG. 12 A schematic view showing a manufacturing process according to the manufacturing method 3 of the structural body.

FIG. 11 and FIG. 12 are schematic views each showing a manufacturing process of a manufacturing method 3 of the structural body 100.

As shown in FIG. 11(a), the substrate 150 is prepared, and as shown in FIG. 11(b), on the substrate 150, the photosensitive resist film R is formed. The resist film R can be formed by spin coating, and a thickness thereof can be set to approximately 100 to 200 nm. Conditions of the spin coating are, for example, a rotation speed of 3000 rpm, a duration time of 30 sec, and performing a thermal treatment at 180° C. for 3 minutes immediately after coating.

Subsequently, a photo mask is disposed, and exposure is performed. Exposure conditions are, for example, an irradiation output of 40 mJ/sec and an irradiation time of 2.5 sec. After the exposure, the substrate 150 is immersed in a developer, and as shown in FIG. 11(c), a patterning portion of the resist film R is removed. An immersion time is 50 sec, for example. After that, washing and drying are performed.

Subsequently, as shown in FIG. 11(d), the conductive layer 301 is laminated. The conductive layer 301 can be laminated by evaporation, for example. Lamination conditions are, for example, an evaporation speed of 5 Å/sec, and an evaporation time of 20 sec.

Subsequently, as shown in FIG. 12(a), on the conductive layer 301, the dielectric layer 302 is laminated. The dielectric layer 302 is, for example, $Al_2O_3$, $HfO_2$, SiO, $La_2O_3$, $SiO_2$, STO, $Ta_2O_5$, $TiO_2$, ZnO, or the like, and can be laminated by an atomic layer deposition method. A thickness of the dielectric layer 302 can be set to 5 nm, and a deposition condition can be set to 200° C.

Subsequently, lifting off is performed by using an organic solvent or the like, and as shown in FIG. 12(b), the resist film R is removed. As the organic solvent, cyclopentanone, acetone, isopropyl alcohol, or the like can be used. After that, washing and drying are performed. As a result, on the substrate 150, the conductive layer 301 and the dielectric layer 302 having a ribbon shape are formed.

Subsequently, as shown in FIG. 12(c), on the dielectric layer 302, the graphene layer 303 is laminated. The graphene layer 303 can be laminated by a dry type transfer, for example. The graphene can be deposited by heating a support body such as a copper foil, and supplying a carbon source gas to a surface of the support body. The graphene layer 303 can be obtained by transferring the graphene.

Subsequently, as shown in FIG. 12(d), the graphene layer 303 are separated. This process can be performed by ion beam lithography or reactive ion etching. An irradiation condition is approximately 350 W, for example.

In the way described above, it is possible to manufacture the structural body 100. It should be noted that the conductive layer 301 corresponds to the conductive layer 111 and the conductive layer 121, the dielectric layer 302 corresponds to the dielectric layer 112 and the dielectric layer 122, and the graphene layer 303 corresponds to the graphene layer 113 and the graphene layer 123, respectively.

(Manufacturing Method 4)

Figure 13:
FIG. 13 A schematic view showing a manufacturing process according to a manufacturing method 4 of the structural body.
Figure 13:
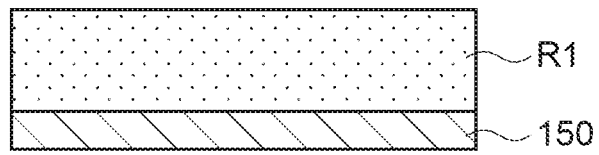
Figure 13:
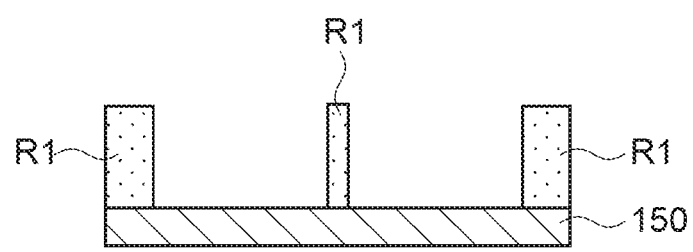
Figure 13:
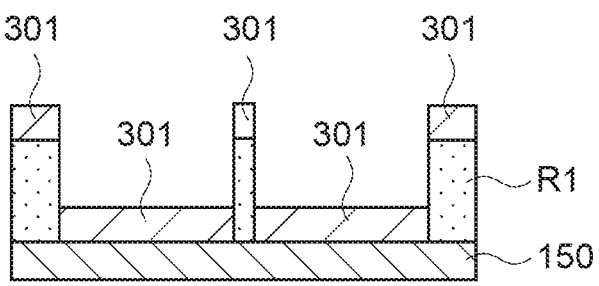
Figure 14:
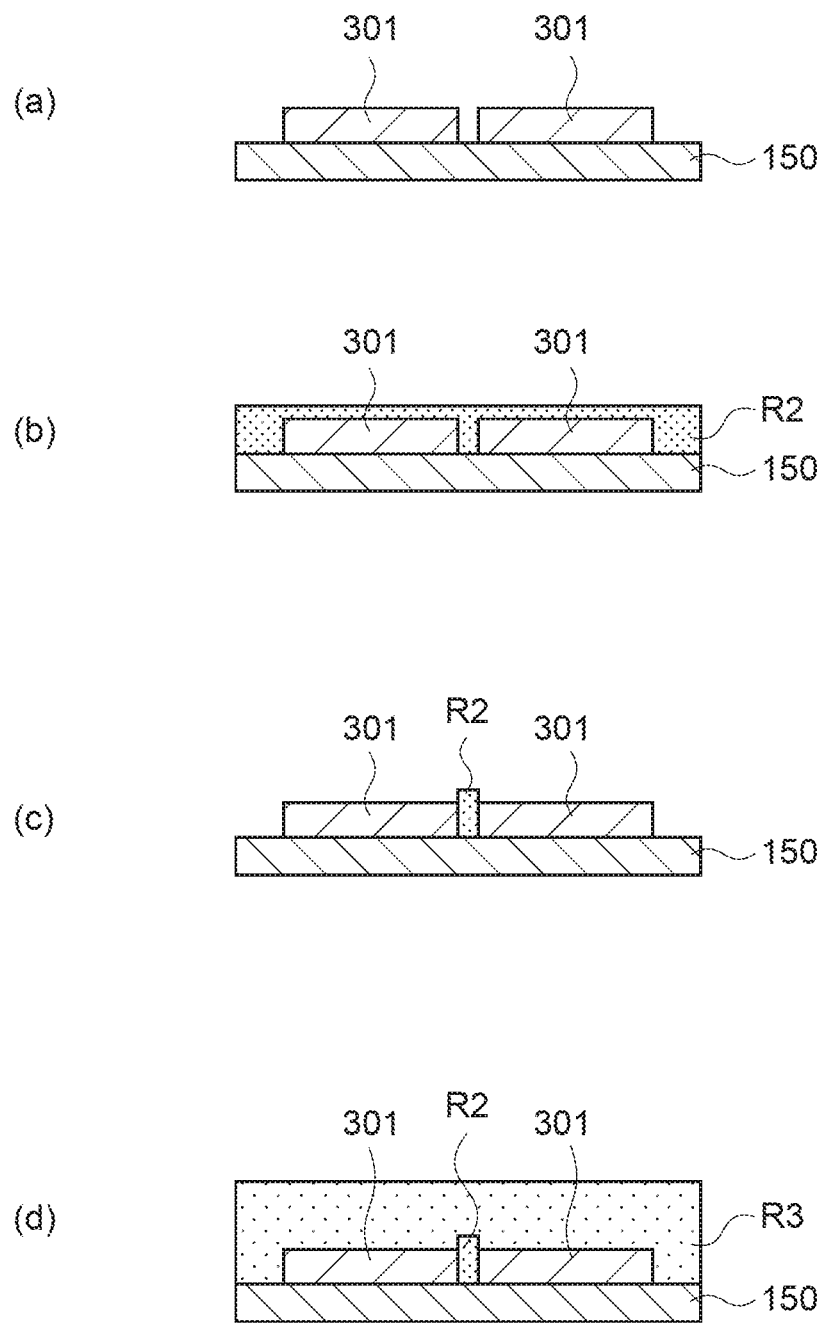
FIG. 14 A schematic view showing a manufacturing process according to the manufacturing method 4 of the structural body.
Figure 15:
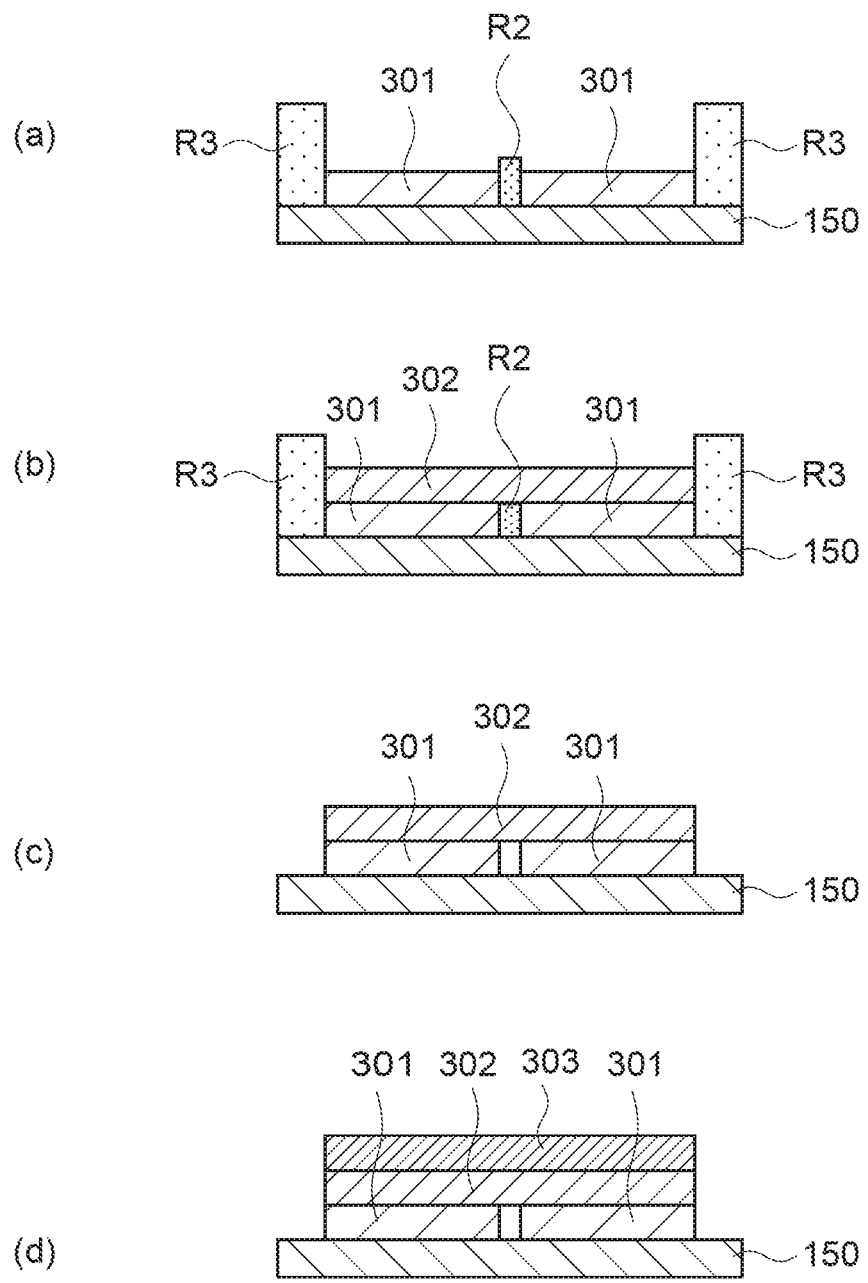
FIG. 15 A schematic view showing a manufacturing process according to the manufacturing method 4 of the structural body.

FIG. 13 to FIG. 15 are schematic views each showing a manufacturing process of a manufacturing method 4 of the structural body 100.

As shown in FIG. 13(a), the substrate 150 is prepared, and as shown in FIG. 13(b), on the substrate 150, a photosensitive resist film R1 is formed. resist film R1 can be formed by spin coating, and a thickness thereof can be set to approximately 100 to 200 nm. Conditions of the spin coating are, for example, a rotation speed of 3000 rpm, a duration time of 30 sec, and performing a thermal treatment at 180° C. for 3 minutes immediately after coating.

Subsequently, a photo mask is disposed, and exposure is performed. Exposure conditions are, for example, an irradiation output of 40 mJ/sec and an irradiation time of 2.5 sec. After the exposure, the substrate 150 is immersed in a developer, and as shown in FIG. 13(c), a patterning portion of the resist film R1 is removed. An immersion condition is, for example, 50 sec. After that, washing and drying are performed.

Subsequently, as shown in FIG. 13(d), the conductive layer 301 is laminated. The conductive layer 301 can be laminated by evaporation, for example. Lamination conditions are, for example, an evaporation speed of 5 Å/sec, and an evaporation time of 20 sec.

Subsequently, lifting off is performed by using an organic solvent or the like, and as shown in FIG. 14(a), the resist film R1 is removed. As the organic solvent, cyclopentanone, acetone, isopropyl alcohol, or the like can be used. After that, washing and drying are performed. As a result, on the substrate 150, the conductive layer 301 having the ribbon shape is formed.

Subsequently, as shown in FIG. 14(b), on the substrate 150 and the conductive layer 301, a photosensitive resist film R2 is formed. The resist film R2 can be formed by spin coating, and a thickness thereof can be set to approximately 100 to 200 nm. Conditions of the spin coating are, for example, a rotation speed of 5000 rpm, a duration time of 30 sec, and performing a thermal treatment at 180° C. for 3 minutes immediately after coating.

Subsequently, a photo mask is disposed, and exposure is performed. Exposure conditions are, for example, an irradiation output of 40 mJ/sec and an irradiation time of 2.5 sec. After the exposure, the substrate 150 is immersed in a developer, and as shown in FIG. 14(c), a patterning portion of the resist film R2 is removed. An immersion time is 50 sec, for example. After that, washing and drying are performed. In addition, surface polishing is performed, and a state is formed in which a gap formed in the conductive layer 301 is embedded with the resist film R2.

Subsequently, as shown in FIG. 14(d), on the substrate 150 and the conductive layer 301, a photosensitive resist film R3 is formed. The resist film R3 can be formed by spin coating, and a thickness thereof can be set to approximately 100 to 200 nm. Conditions of the spin coating are, for example, a rotation speed of 3000 rpm, a duration time of 30 sec, and performing a thermal treatment at 180° C. for 3 minutes immediately after coating.

Subsequently, a photo mask is disposed, and exposure is performed. Exposure conditions are, for example, an irradiation output of 40 mJ/sec and an irradiation time of 2.5 sec. After the exposure, the substrate 150 is immersed in a developer, and as shown in FIG. 15(a), a patterning portion of the resist film R3 is removed. An immersion time is 50 sec, for example. After that, washing and drying are performed.

Subsequently, as shown in FIG. 15(b), on the conductive layer 301, the dielectric layer 302 is laminated. The dielectric layer 302 is, for example, $Al_2O_3$, $HfO_2$, $SiO$, $La_2O_3$, $SiO_2$, STO, $Ta_2O_5$, $TiO_2$, ZnO, or the like, and can be laminated by an atomic layer deposition method. A thickness of the dielectric layer 302 can be set to 5 nm, and a deposition temperature thereof can be set to 200° C.

Subsequently, lifting off is performed by using an organic solvent or the like, and as shown in FIG. 15(c), the resist film R2 and the resist film R3 are removed. As the organic solvent, cyclopentanone, acetone, isopropyl alcohol, or the like can be used. After that, washing and drying are performed. As a result, on the substrate 150, the conductive layer 301 and the dielectric layer 302 having a ribbon shape are formed.

Subsequently, as shown in FIG. 15(d), on the dielectric layer 302, the graphene layer 303 is laminated. The graphene layer 303 can be laminated by a dry type transfer, for example. The graphene can be obtained by heating a support body such as a copper foil, supplying a carbon source gas to a surface of the support body, and depositing a film.

Subsequently, the graphene layer 303 are separated (see FIG. 8). This process can be performed by ion beam lithography or reactive ion etching. An irradiation condition is approximately 350 W, for example. At this time, the dielectric layer 302 may be separated at the same time.

In the way described above, it is possible to manufacture the structural body 100. It should be noted that the conductive layer 301 corresponds to the conductive layer 111 and the conductive layer 121, the dielectric layer 302 corresponds to the dielectric layer 112 and the dielectric layer 122, and the graphene layer 303 corresponds to the graphene layer 113 and the graphene layer 123, respectively.

[Usage of Electromagnetic Wave Detection Element]

Figure 16:
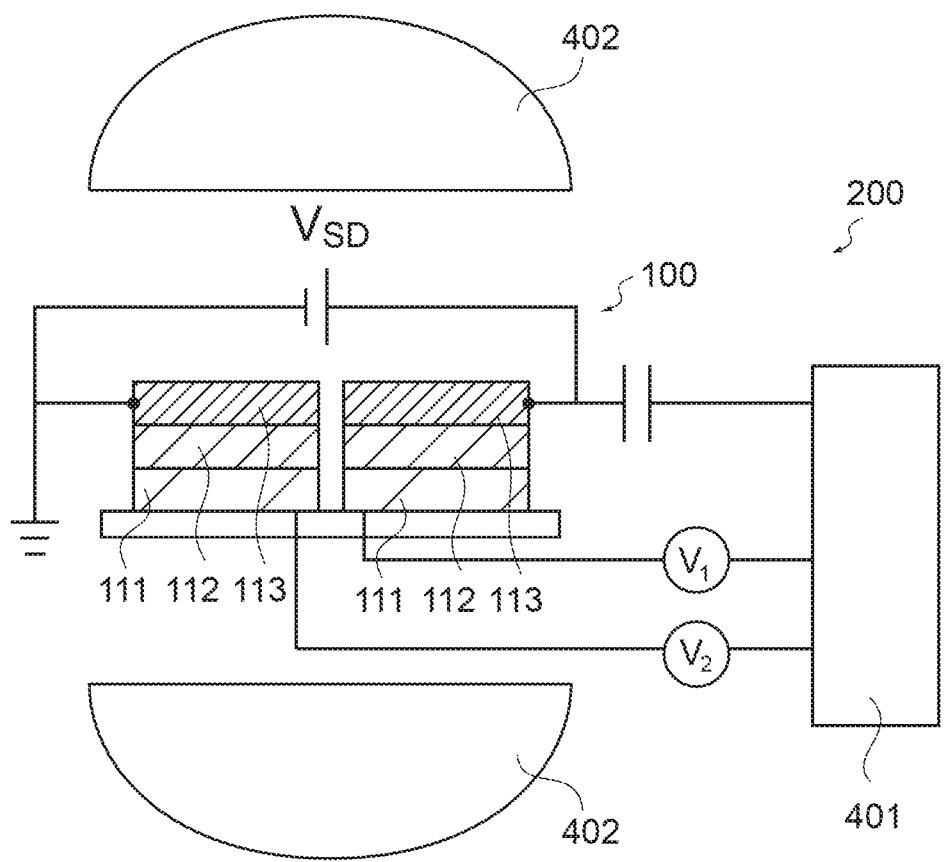
FIG. 16 A schematic view showing an electromagnetic wave sensor according to the embodiment of the present technology.

The electromagnetic wave detection element 200 according to the present technology can be used as an electromagnetic wave detection sensor for proximity wireless reception. FIG. 16 is a schematic view showing an electromagnetic wave sensor for proximity wireless reception which uses the electromagnetic wave detection element 200.

As shown in the figure, the electromagnetic wave sensor is constituted of the electromagnetic wave detection element 200, a detection control apparatus 401, and a dielectric lens 402. The detection control apparatus 401 includes the signal processing circuit 160 therein. It should be noted that the dielectric lens 402 may be provided only one of front and back sides of the structural body 100.

When an electromagnetic wave such as a terahertz wave or the like is incident on the dielectric lens 402 from a large transmission device, the electromagnetic wave is guided by the dielectric lens 402 to the structural body 100, and is output from the signal processing circuit 160 as a potential difference between the source and drain by using the SPP as described above. The detection control apparatus 401 detects the electromagnetic wave on the basis of the output of the signal processing circuit 160. The electromagnetic wave detection element 200 can be miniaturized, and thus can be used as a compact reception sensor for proximity wireless reception.

Figure 17:
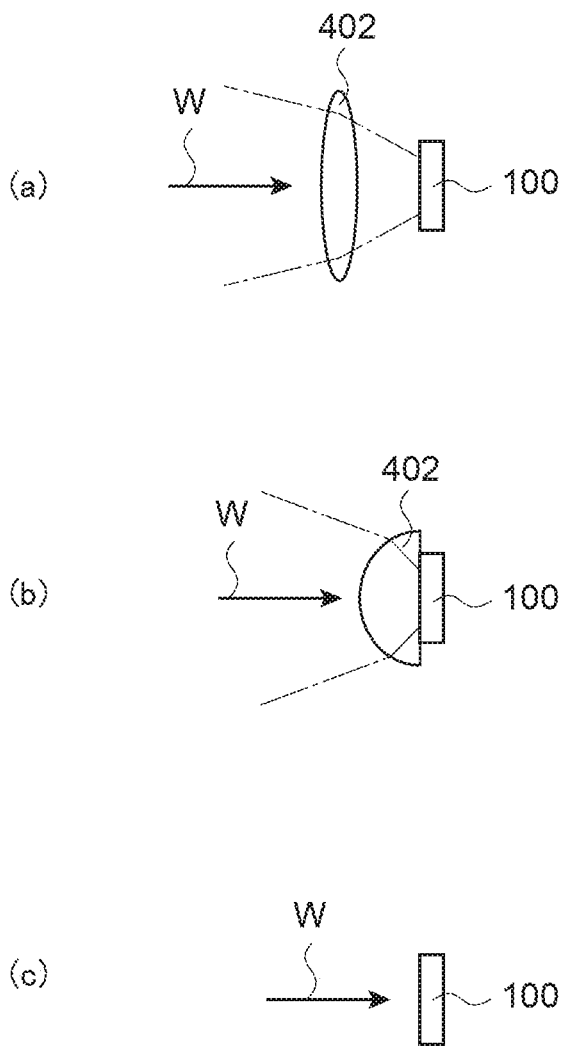
FIG. 17 A schematic view showing a positional relationship between the structural body and a dielectric lens in the electromagnetic wave sensor.

FIG. 17 is a schematic view showing a method of using the dielectric lens 402 and the structural body 100 in combination. As shown in FIG. 17(a), the dielectric lens 402 and the structural body 100 may be separated, and as shown in FIG. 17(b), the dielectric lens 402 and the structural body 100 may be integrally configured. Further, as shown in FIG. 17(c), the structural body 100 may be singly used.

It should be noted that the structural body 100 can be used not only to receive the electromagnetic wave but also to transmit the electromagnetic wave.

Further, the electromagnetic wave detection element 200 can be used as a passive-type THz imaging element with a scan system. The imaging element can have a configuration similar to the electromagnetic wave detection sensor shown in FIG. 16 except being provided with the dielectric lens 402.

Figure 18:
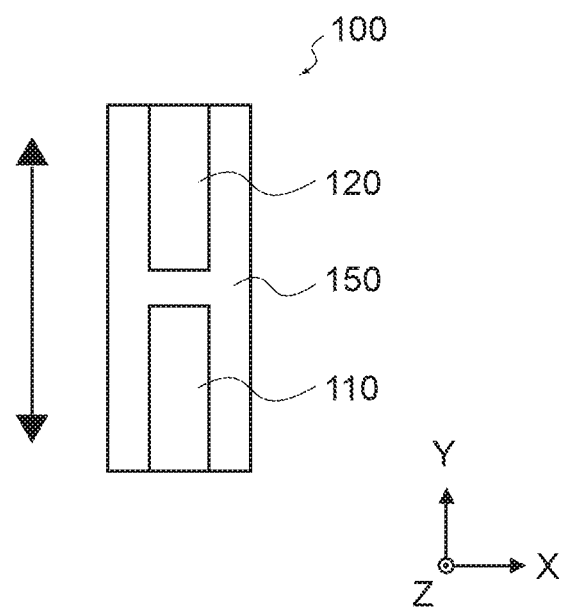
FIG. 18 A plan view showing a structural body in the electromagnetic wave detection element according to the embodiment of the present technology.

The imaging element using the electromagnetic wave detection element 200 can be arrayed. FIG. 18 is a plan view showing the structural body 100. As indicated by an arrow in the figure, a direction in which the antenna unit 110 and the detection unit 120 are oriented (Y direction in FIG. 18) is a polarization direction.

Figure 19:
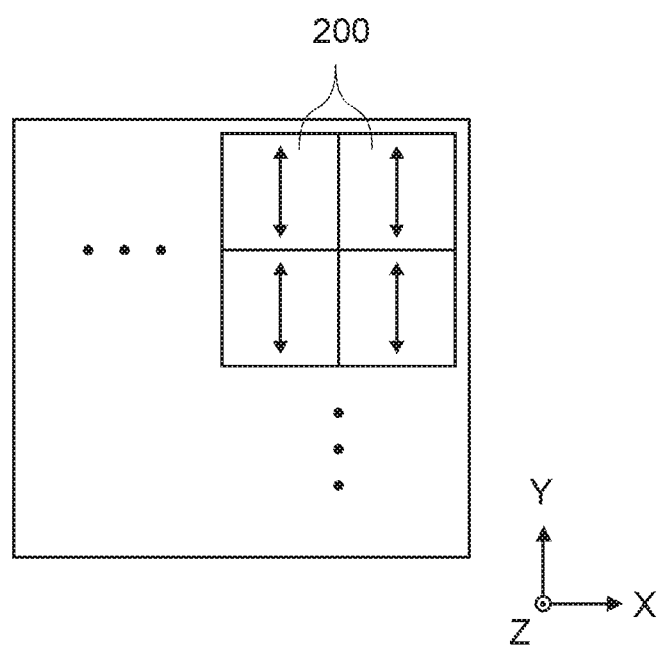
FIG. 19 A schematic view showing an array of the electromagnetic wave detection element.
Figure 20:
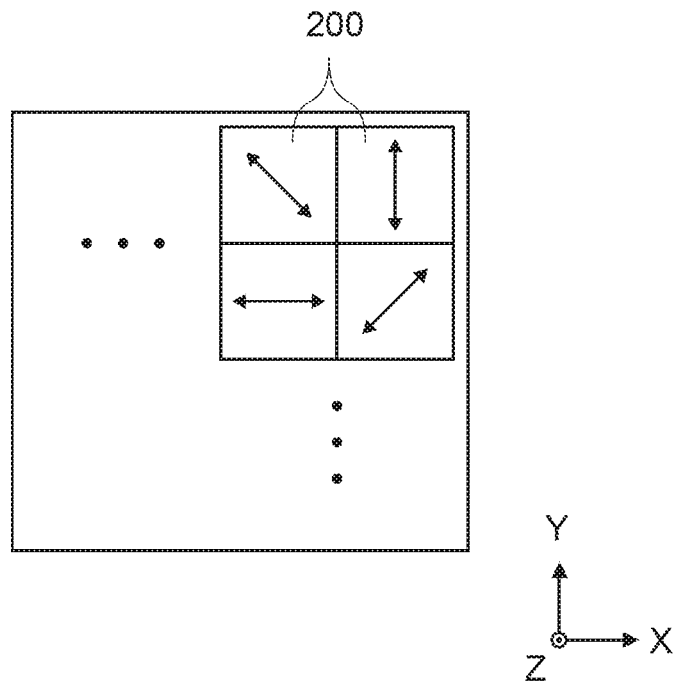
FIG. 20 A schematic view showing the array of the electromagnetic wave detection element.

FIG. 19 and FIG. 20 are schematic views each showing an image pickup element in which the electromagnetic wave detection elements 200 are arrayed. As shown in FIG. 19, by arranging the electromagnetic wave detection elements 200 in such a manner that the polarization directions are in one direction, with the result that the polarization array can be configured. Further, as shown in FIG. 20, the electromagnetic wave detection elements 200 are arranged in such a manner that the polarization directions are in various directions, with the result that spectral array can be configured.

Figure 21:
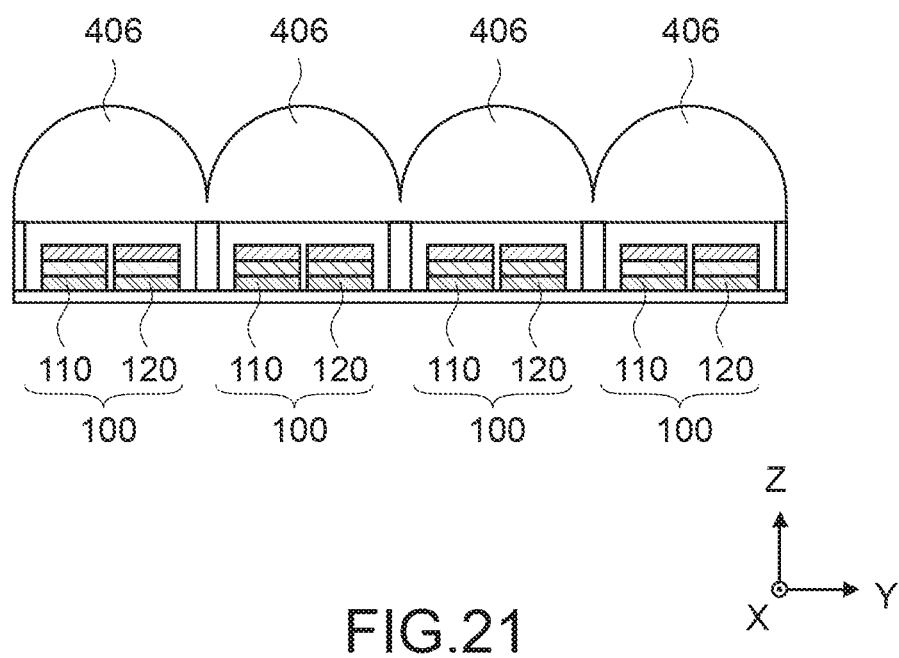
FIG. 21 A schematic view of an imaging element which uses the electromagnetic wave detection element.

Further, the electromagnetic wave detection element 200 can be used as a one-shot type THz imaging element with no scan system. FIG. 21 and FIG. 22 are schematic views each showing the imaging element. As shown in the figures, it is possible to configure the THz imaging element by arranging the plurality of electromagnetic wave detection elements 200 and a plurality of micro lenses 406. The THz imaging element as described above can be used for a micro bolometer or the like.

Examples of a material of the micro lenses 406 appropriate to the THz band include a high-resistance float zone silicon (HRFZ-Si), diamond, crystal, sapphire, polyethylene, polypropylene, polytetrafluoroethylene, Teflon, and polyethymenthene.

As described above, the electromagnetic wave detection element 200 according to the present technology can be mounted on various electronic apparatuses such as a communication apparatus and an imaging apparatus.

It should be noted that, the present technology can take the following configurations.

(1)
An electromagnetic wave detection element, including:
an antenna unit including a first conductive layer made of a conductive material, a first dielectric layer that is laminated on the first conductive layer and is constituted of a dielectric body, and a first graphene layer that is laminated on the first dielectric layer and is made of graphene; and
a detection unit including a second conductive layer that is made of a conductive material and is separated from the first conductive layer, a second dielectric layer that is laminated on the second conductive layer and is constituted of a dielectric body, and a second graphene layer that is laminated on the second dielectric layer, is made of graphene, and is separated from the first graphene layer.

(2)
The electromagnetic wave detection element according to (1) described above, in which
the first graphene layer and the second graphene layer are each constituted of an atomic monolayer of graphene.

(3)
The electromagnetic wave detection element according to (1) or (2) described above, in which
the first graphene layer and the second graphene layer each have a nanoribbon shape that is extended along a direction in which the first graphene layer and the second graphene layer are separated from each other.

(4)
The electromagnetic wave detection element according to any one of (1) to (3) described above, in which
a distance between the first graphene layer and the second graphene layer is equal to or less than 5 µm.

(5)
The electromagnetic wave detection element according to any one of (1) to (4) described above, in which
the first electrode layer is connected to a first gate power supply, the second electrode layer is connected to a second gate power supply, and the first graphene layer and the second graphene layer are connected to an operational amplifier that outputs a potential difference between the first graphene layer and the second graphene layer.

(6)
An electromagnetic wave sensor, including:
an antenna unit including a first conductive layer made of a conductive material, a first dielectric layer that is laminated on the first conductive layer and is constituted of a dielectric body, and a first graphene layer that is laminated on the first dielectric layer and is made of graphene;
a detection unit including a second conductive layer that is made of a conductive material and is separated from the first conductive layer, a second dielectric layer that is laminated on the second conductive layer and is constituted of a dielectric body, and a second graphene layer that is laminated on the second dielectric layer, is made of graphene, and is caused to face the first graphene layer with a predetermined interval therebetween; and
a signal processing circuit that uses the first conductive layer as a first gate, the second conductive layer as a second gate, the first graphene layer as a source, and the second graphene layer as a drain, and outputs a potential difference between the source and the drain.

(7)
An electronic apparatus, including:
an electromagnetic wave sensor including
an antenna unit including a first conductive layer made of a conductive material, a first dielectric layer that is laminated on the first conductive layer and is constituted of a dielectric body, and a first graphene layer that is laminated on the first dielectric layer and is made of graphene,
a detection unit including a second conductive layer that is made of a conductive material and is separated from the first conductive layer, a second dielectric layer that is laminated on the second conductive layer and is constituted of a dielectric body, and a second graphene layer that is laminated on the second dielectric layer, is made of graphene, and is caused to face the first graphene layer with a predetermined interval therebetween, and
a signal processing circuit that uses the first conductive layer as a first gate, the second conductive layer as a second gate, the first graphene layer as a source, and the second graphene layer as a drain, and outputs a potential difference between the source and the drain.

(8)
A structural body, including:
an antenna unit including a first conductive layer made of a conductive material, a first dielectric layer that is laminated on the first conductive layer and is constituted of a dielectric body, and a first graphene layer that is laminated on the first dielectric layer and is made of graphene; and
a detection unit including a second conductive layer that is made of a conductive material and is separated from the first conductive layer, a second dielectric layer that is laminated on the second conductive layer and is constituted of a dielectric body, and a second graphene layer that is laminated on the second dielectric layer, is made of graphene, and is caused to face the first graphene layer with a predetermined interval therebetween.

REFERENCE SIGNS LIST 100 structural body
110 antenna unit
111 conductive layer
112 dielectric layer
113 graphene layer
120 detection unit
121 conductive layer
122 dielectric layer
123 graphene layer
160 signal processing circuit
200 electromagnetic wave detection element

The invention claimed is:

1. An electromagnetic wave detection element, comprising:
an operational amplifier;
an antenna unit including:
a first conductive layer made of a first conductive material,
a first dielectric layer laminated on the first conductive layer and constituted of a first dielectric body, and
a first graphene layer laminated on the first dielectric layer, made of graphene, and connected to the operational amplifier; and
a detection unit including:
a second conductive layer made of a second conductive material and separated from the first conductive layer,
a second dielectric layer laminated on the second conductive layer and constituted of a second dielectric body, and
a second graphene layer laminated on the second dielectric layer, made of graphene, separated from the first graphene layer, and connected to the operational amplifier, wherein the operational amplifier outputs a potential difference between the first graphene layer and the second graphene layer.

2. The electromagnetic wave detection element according to claim 1, wherein
the first graphene layer and the second graphene layer are each constituted of an atomic monolayer of graphene.

3. The electromagnetic wave detection element according to claim 1, wherein
the first graphene layer and the second graphene layer each have a nanoribbon shape extending along a direction in which the first graphene layer and the second graphene layer are separated from each other.

4. The electromagnetic wave detection element according to claim 1, wherein
a distance between the first graphene layer and the second graphene layer is equal to or less than 5 µm.

5. The electromagnetic wave detection element according to claim 1, wherein
the first conductive layer is connected to a first gate power supply and the second conductive layer is connected to a second gate power supply supply.

6. An electromagnetic wave sensor, comprising:
an antenna unit including:
a first conductive layer made of a first conductive material,
a first dielectric layer laminated on the first conductive layer and constituted of a first dielectric body, and
a first graphene layer laminated on the first dielectric layer and made of graphene;
a detection unit including:
a second conductive layer made of a second conductive material and separated from the first conductive layer,
a second dielectric layer laminated on the second conductive layer and constituted of a second dielectric body, and
a second graphene layer laminated on the second dielectric layer, made of graphene, and facing the first graphene layer with a predetermined interval between the first graphene layer and the second graphene layer; and
a signal processing circuit that uses the first conductive layer as a first gate, the second conductive layer as a second gate, the first graphene layer as a source, and the second graphene layer as a drain, and outputs a potential difference between the first graphene layer and the second graphene layer.

7. An electronic apparatus, comprising:
an electromagnetic wave sensor including:
an antenna unit including:
a first conductive layer made of a first conductive material,
a first dielectric layer laminated on the first conductive layer and constituted of a first dielectric body, and
a first graphene layer laminated on the first dielectric layer and made of graphene,
a detection unit including:
a second conductive layer made of a second conductive material and separated from the first conductive layer,
a second dielectric layer laminated on the second conductive layer and constituted of a second dielectric body, and
a second graphene layer laminated on the second dielectric layer, made of graphene, and facing the first graphene layer with
a predetermined interval therebetween, and
a signal processing circuit that uses the first conductive layer as a first gate, the second conductive layer as a second gate, the first graphene layer as a source, and the second graphene layer as a drain, and outputs a potential difference between the first graphene layer and the second graphene layer.

8. A structural body, comprising:
an operational amplifier;
an antenna unit including:
a first conductive layer made of a first conductive material,
a first dielectric layer laminated on the first conductive layer and constituted of a first dielectric body, and
a first graphene layer laminated on the first dielectric layer, made of graphene, and connected to the operational amplifier; and
a detection unit including:
a second conductive layer made of a second conductive material and separated from the first conductive layer,
a second dielectric layer laminated on the second conductive layer and constituted of a second dielectric body, and a second graphene layer laminated on the second dielectric layer, made of graphene, facing the first graphene layer with a predetermined interval between the first graphene layer and the second graphene layer, and connected to the operational amplifier, wherein the operational amplifier outputs a potential difference between the first graphene layer and the second graphene layer.

\* \* \* \* \*